(12) United States Patent
Suzuki et al.

(10) Patent No.: US 7,887,340 B2
(45) Date of Patent: Feb. 15, 2011

(54) FIXING STRUCTURE OF RELAY CONNECTOR

(75) Inventors: Hisashi Suzuki, Tokyo (JP); Ryoichi Hirako, Tokyo (JP)

(73) Assignee: Yokowo Co., Ltd., Tokyo (JP)

( * ) Notice: Subject to any disclaimer, the term of this patent is extended or adjusted under 35 U.S.C. 154(b) by 0 days.

(21) Appl. No.: 12/698,504

(22) Filed: Feb. 2, 2010

(65) Prior Publication Data
US 2010/0197154 A1 Aug. 5, 2010

(30) Foreign Application Priority Data
Feb. 3, 2009 (JP) .......................... P. 2009-022478

(51) Int. Cl.
*H01R 24/02* (2006.01)
(52) U.S. Cl. ...................... 439/122; 439/716
(58) Field of Classification Search ................. 439/122, 439/716, 121, 532
See application file for complete search history.

(56) References Cited

U.S. PATENT DOCUMENTS

| | | | |
|---|---|---|---|
| 3,993,385 A * | 11/1976 | Seger ......................... | 439/122 |
| 5,000,692 A * | 3/1991 | Taniguchi et al. ............ | 439/160 |
| 5,145,418 A * | 9/1992 | Moranski et al. ............. | 439/716 |
| 6,079,992 A * | 6/2000 | Kuchar et al. ................ | 439/122 |
| 6,840,819 B2 * | 1/2005 | Bet et al. ..................... | 439/716 |
| 2003/0143896 A1 * | 7/2003 | Bet et al. ..................... | 439/716 |

FOREIGN PATENT DOCUMENTS

JP 2008-171801 7/2008

* cited by examiner

*Primary Examiner*—Gary F. Paumen
(74) *Attorney, Agent, or Firm*—Morgan, Lewis & Bockius LLP

(57) ABSTRACT

A fixing structure of a relay connector includes: a guide block fixed to a lower portion of the relay connector; a movable support shaft movable in a first direction perpendicular to a second direction which is parallel to an axial direction of the coaxial connector; lock plates provided at both ends of the movable support shaft; a fixing operating lever provided inside the guide block so as to swing around a lever support shaft and provided with a cam part; and a rail member provided with a pair of slide parts, the guide block inserted between the slide parts. When the fixing operating lever is swung to be tilted to one side, the upper and lower surfaces of the slide parts are clamped and fixed between the side parts of the lower portion of the relay connector and the lock plates. When the fixing operating lever is swung to be tilted to the other side, the relay connector can move in the second direction.

7 Claims, 15 Drawing Sheets

FIXING STRUCTURE OF RELAY CONNECTOR

BACKGROUND OF THE INVENTION

The present invention relates to a fixing structure of a relay connector capable of easily providing a board on a relay connector for electrically connecting a core conductor of a coaxial connector to a terminal electrode which is provided on a surface of the board, and for electrically connecting a shell ground (GND) of the coaxial connector to a GND electrode which is provided on a back surface of the board, for the purpose of inspecting the board.

In designing and producing a high frequency circuit board or the like, it is necessary to evaluate its performance in a course of designing. Therefore, by electrically connecting a core conductor of a coaxial connector to a terminal electrode which is provided at an end of a surface of the board, and by electrically connecting a shell GND of the coaxial connector to a GND electrode which is provided at an end of a back surface of the board, evaluation of the performance is achieved on the basis of a high frequency signal which is obtained from the terminal electrode. On this occasion, in case where a structure for electrically connecting the core conductor of the coaxial connector to the terminal electrode and electrically connecting the shell GND of the coaxial connector to the GND electrode is formed by soldering work, the work is complicated. Moreover, a work for removing the coaxial connector which has been soldered and fixed, from the board is also complicated. In view of the above, a related-art relay connector in which the coaxial connector can be attached to the board, without soldering has been already proposed (refer to JP-A-2008-171801).

The related-art relay connector disclosed in JP-A-2008-171801 will be briefly described referring to FIGS. 13A to 15. FIGS. 13A, 13B and 13C are views showing an outer appearance of the related-art relay connector. FIG. 13A is a side view, FIG. 13B is a plan view, and FIG. 13C is a front view. FIG. 14 is a sectional view as seen from arrow marks A-A in FIG. 13B. FIG. 15 is an exploded perspective view of the relay connector as shown in FIGS. 13A to 13C. In the related-art relay connector as shown in FIGS. 13A to 15, a through hole 20a is provided in a main block 20 formed of conductive material, a dielectric member 22b projected from a shell GND 22a of a coaxial connector (an SMA connector, for example) 22 is inserted into the through hole 20a from a back surface, the shell GND 22a is fixed with screws to the back surface to be electrically connected, and further, a core conductor 22c which has been exposed by stripping off the dielectric member 22b is projected from a front surface of the main block 20. On this occasion, an end surface of the dielectric member 22b is at a substantially same position as the front surface of the main block 20 or at a slightly retreated position from the front surface. Moreover, an axial direction in which the core conductor 22c is projected is perpendicular to the front surface of the main block 20. Guide pins 24, 24 are uprightly provided in the main block 20 in parallel with the front surface of the main block 20. A GND block 26 formed of conductive material is provided with guide holes 26a, 26a into which the guide pins 24, 24 are inserted. By detachably inserting the guide pins 24, 24 into these guide holes 26a, 26a, the GND block 26 can relatively move with respect to the main block 20 in sliding contact with each other, in a linear direction parallel to the front surface of the main block 20. Further, the GND block 26 is provided with a board rest part 26b so as to be opposed to the core conductor 22c in such a manner that the board rest part 26b can move in a direction of approaching or separating from the core conductor 22c by the relative movement.

Further, moving range regulating screws 32, 32 are passed through moving range regulating through holes 30a, 30a which are formed in a vertical direction in an operating member 30, so as to move within a determined range in an axial direction. Then, distal ends of the moving range regulating screws 32, 32 are screwed into the main block 20 at an opposite side to a position where the GND block 26 is provided with respect to the core conductor 22c, and erected, in such a manner that the operating member 30 can relatively move in a direction of approaching or separating from the main block 20 within a determined range. On this occasion, a direction of the GND block 26 approaching or separating from the core conductor 22c and a direction of the operating member 30 approaching or separating from the main block are parallel to each other. In addition, elastic springs 34, 34 as elastic members are provided in a contracted state between the operating member 30 and the main block 20, whereby the operating member 30 is elastically urged in a direction of separating from the main block 20. Still further, the operating member 30 and the GND block 26 are connected to each other by means of connecting members 38, 38 with connecting pins 36, 36. These connecting members 38, 38 allow the GND block 26 to move in a direction of approaching or separating with respect to the core conductor 22c in association with the movement of the operating member 30 in the approaching or separating direction. Still further, a leaf spring 40 having conductivity is fixed to the GND block 26 with small screws. The leaf spring 40 is slidably provided in elastic contact with the main block 20, and electrically connected thereto. It is to be noted that a lateral width W of the related-art relay connector is set to be 12.7 mm, for example, which is equal to the lateral width of the shell GND 22a of the coaxial connector 22.

In the related-art relay connector disclosed in JP-A-2008-171801, the board is inserted between the core conductor 22c and the board rest part 26b, by enlarging a distance between the core conductor 22c and the board rest part 26b by the relative movement of the main block 20 and the GND block 26, and the board can be clamped between the core conductor 22c and the board rest part 26b by reducing the distance between them by the relative movement. Then, the core conductor 22c of the coaxial connector 22 is brought into contact with a terminal electrode provided on a surface of the board to be electrically connected, and a GND electrode provided on a back surface of the board is electrically connected to the shell GND 22a of the coaxial connector 22 by way of the GND block 26 having the board rest part 26b and the main block 20. In this manner, it is possible to easily electrically connect the board to the coaxial connector 22. Moreover, it is possible to easily detach the board which has been inserted between the core conductor 22c and the board rest part 26b, by enlarging the distance between them by the relative movement. When the operating member 30 is pressed to move toward the main block 20 against elastic forces of the elastic members 34, 34, the board rest part 26b of the GND block 26 which is connected to the operating member 30 by means of the connecting members 38, 38 relatively moves in a direction of separating from the core conductor 22c, and the distance between the core conductor 22c and the board rest part 26b is enlarged, whereby the board can be inserted between them. Further, when the pressure on the operating member is released, the board can be clamped between the core conductor 22c and the board rest part 26b with the elastic forces. The related-art relay connector disclosed in JP-A-2008-171801 is fixed to a base seat with screws or the like in a position where it corresponds to an outer shape of the board and opposes to the terminal electrode 12 arranged on the board.

Further, a related-art structure of a relay connector in which the related art disclosed in JP-A-2008-171801 is further improved, has been proposed in Japanese Patent Application No. 2008-296620. In this related-art structure, the GND block is relatively moved with respect to the main block, and the distance between the core conductor and the board rest part is enlarged or reduced, thereby to insert and clamp the board between them, in the same manner as the related art disclosed in JP-A-2008-171801. However, in the related-art structure in Japanese Patent Application No. 2008-296620, operation of the operating member is more reliably transmitted to the GND block by means of the connecting members. Moreover, the relay connector is mounted on a slide rail which is longer in a projecting direction of the core conductor in such a manner that a position of the relay connector can be changed in a longitudinal direction of the slide rail, by regulating movement of the slide rail in the longitudinal direction thereof by an elastic force of a spring, and at the same time, by applying a larger force than the regulating force by the elastic force of the spring. Still further, a related-art relay connector in which a spark plug type connector is used as the coaxial connector, instead of an SMA type connector, has been proposed in Japanese Patent Application No. 2009-016602.

In the related art for fixing the relay connector disclosed in JP-A-2008-171801 to the base seat, there is no problem in providing the board on the relay connector, in case where the board has a rectangular shape, and the terminal electrodes are arranged at one side of the board or at two adjacent sides. However, in case where the terminal electrodes are arranged at two sides at both ends of the board opposed to each other, an interval at which the relay connector is to be provided is fixed, and the board must be exactly inserted between them. This work is very complicated. Further, in case where the terminal electrodes are arranged at all the four sides, it is impossible to correctly provide the board on the relay connector. Moreover, in the related art in Japanese Patent Application No. 2008-296620, the relay connector is allowed to move in the longitudinal direction of the slide rail, and therefore, even though the terminal electrodes are arranged at the four sides of the board, it is possible to correctly provide the relay connector by moving it so as to approach or separate from the board, after the board has been appropriately provided. However, because the position of the relay connector in the longitudinal direction of the slide rail is regulated by the elastic force of the spring, the force for regulating the position becomes short, in case where easy movement in the longitudinal direction is intended. Therefore, there is such anxiety that the relay connector is displaced, when a force for pulling a coaxial cable which is connected to the relay connector is exerted. In contrast, in case where the elastic force of the spring for regulating the position is increased, there occurs such inconvenience that the movement in the longitudinal direction cannot be smoothly achieved.

SUMMARY

It is therefore an object of the invention to provide a fixing structure of a relay connector in which the relay connector can move in a projecting direction of a core conductor, and at the same time, can be reliably fixed.

In order to achieve the object, according to the invention, there is provided a fixing structure of a relay connector in which a core conductor of a coaxial connector is connected to a terminal electrode which is provided at an end of a surface of a board, and a shell GND of the coaxial connector is connected to a GND electrode which is provided at an end of a back surface of the board, the core conductor being projected from a surface of a conductive first block, a conductive second block having a board rest part on which the board is to be placed, the second block being electrically connected to the first block and operable to move with respect to the first block so that the board rest part relatively moves in a direction of approaching or separating from the core conductor in a direction parallel to the surface of the first block, whereby a distance between the core conductor and the board rest part is enlarged for enabling the board to be inserted between the core conductor and the board rest part, and the board is clamped between the core conductor and the board rest part, the fixing structure of the relay connector comprising:

a guide block including a first member, a second member opposed to the first member and a third member connected to the first and second members, the first, second and third members defining a U shape opened to a lower side, the third member is fixed to a lower portion of the relay connector;

a movable support shaft passing through the first and second members of the guide block so as to be movable in a first direction perpendicular to a second direction which is parallel to an axial direction of the coaxial connector;

lock plates respectively provided at both ends of the movable support shaft outside of the guide block;

a lever support shaft provided below the movable support shaft across the first and second members of the guide block in the first direction;

a fixing operating lever provided inside the guide block so as to swing around the lever support shaft and provided with a cam part adapted to come into contact with the movable support shaft so as to move the movable support shaft in the first direction; and a rail member extending in the second direction and provided with a pair of slide parts which are parallel and opposed to each other, the guide block being inserted between the slide parts so as to be movable in the second direction, both side parts of the lower portion of the relay connector being mounted on upper surfaces of the slide parts, the lock plates being opposed to lower surfaces of the slide parts, wherein when the fixing operating lever is swung to be tilted to one side, the movable support shaft is pushed upward by the cam part, and the lock plates press the lower surfaces of the slide parts thereby to push the guide block downward, whereby the upper and lower surfaces of the slide parts are clamped and fixed between the side parts of the lower portion of the relay connector and the lock plates, and when the fixing operating lever is swung to be tilted to the other side, the cam part allows the movable support shaft to move downward thereby to move the lock plates downward, whereby the relay connector which is mounted on the upper surfaces of the slide parts can move in the second direction.

The lower portion of the relay connector may be formed with a projected portion, both side parts of the projected portion which are formed with stepped portions, a center part of the projected portion which is downwardly projected and to which the third member of the guide block is fixed. The center part of the projected portion may be inserted between the slide parts. The stepped portions of the projected portion may be mounted on the upper surfaces of the slide parts. When the fixing operating lever is swung to be tilted to one side, the movable support shaft is pushed upward by the cam part, and the lock plates press the lower surfaces of the slide parts thereby to push the guide block downward, whereby the upper and lower surfaces of the slide parts are clamped and fixed between the stepped portions of the projected portion and the lock plates.

One end of a pressure plate formed of leaf spring may be fixed to the guide block. The other end of the pressure plate may be in elastically contact with the fixing operating lever, whereby swing of the fixing operating lever is regulated by an elastic force of the pressure plate.

The rail member may include two members respectively having one of the slide parts, being opposed to each other having the slide parts placed inside, and integrally fixed together.

The rail member may be formed with at least an engaging portion at one end portion thereof, so that another rail member can be connected in series in the second direction.

The rail member may be formed with at least an engaging portion at a side portion thereof and another rail member may be formed with an engaging portion at one end portion thereof, so that the side portion of the rail member can be connected to the end portion of the another rail member.

A connecting rail member may be provided with an engaging portion, which can be engaged with an engaging portion formed at an end portion of the rail member, on at least one of side surfaces thereof, so that the end portion of the rail member can be connected to the at least one of the side surfaces of the connecting rail member.

BRIEF DESCRIPTION OF THE DRAWINGS

FIG. 13A is a side view, FIG. 13B is a plan view, and FIG. 13C is a front view.

DETAILED DESCRIPTION OF EMBODIMENTS

Figure 1:
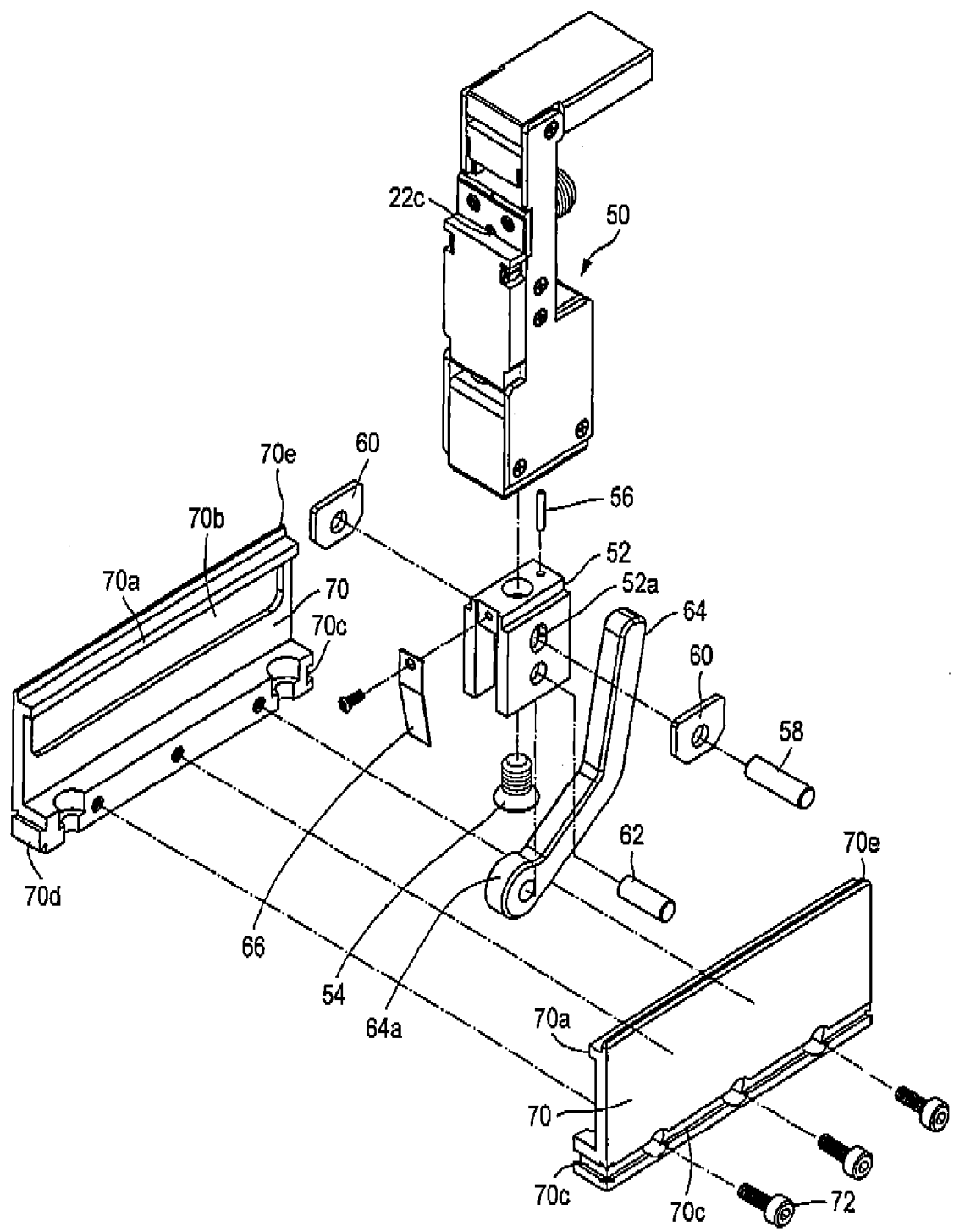
FIG. 1 is an exploded perspective view of a fixing structure of a relay connector in a first embodiment according to the invention.
Figure 2:
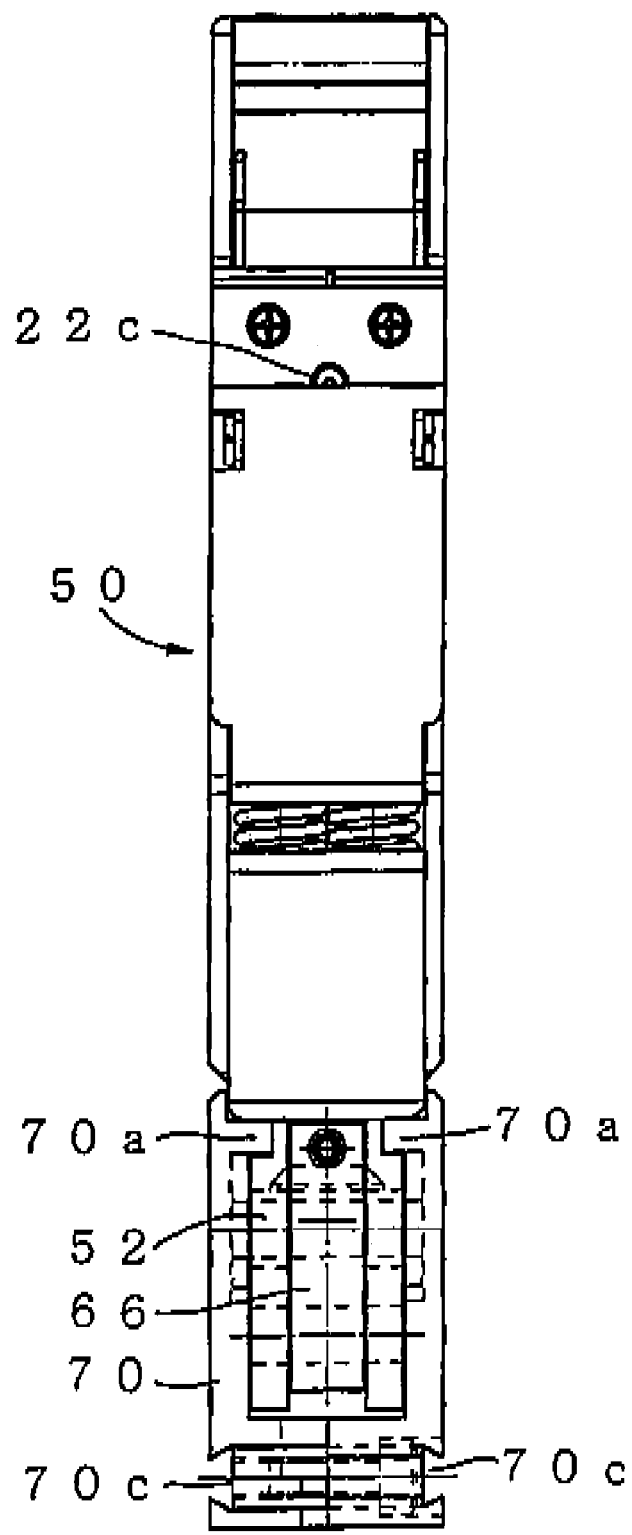
FIG. 2 is a front view of the fixing structure of the relay connector in the first embodiment, in an assembled state.
Figure 3:
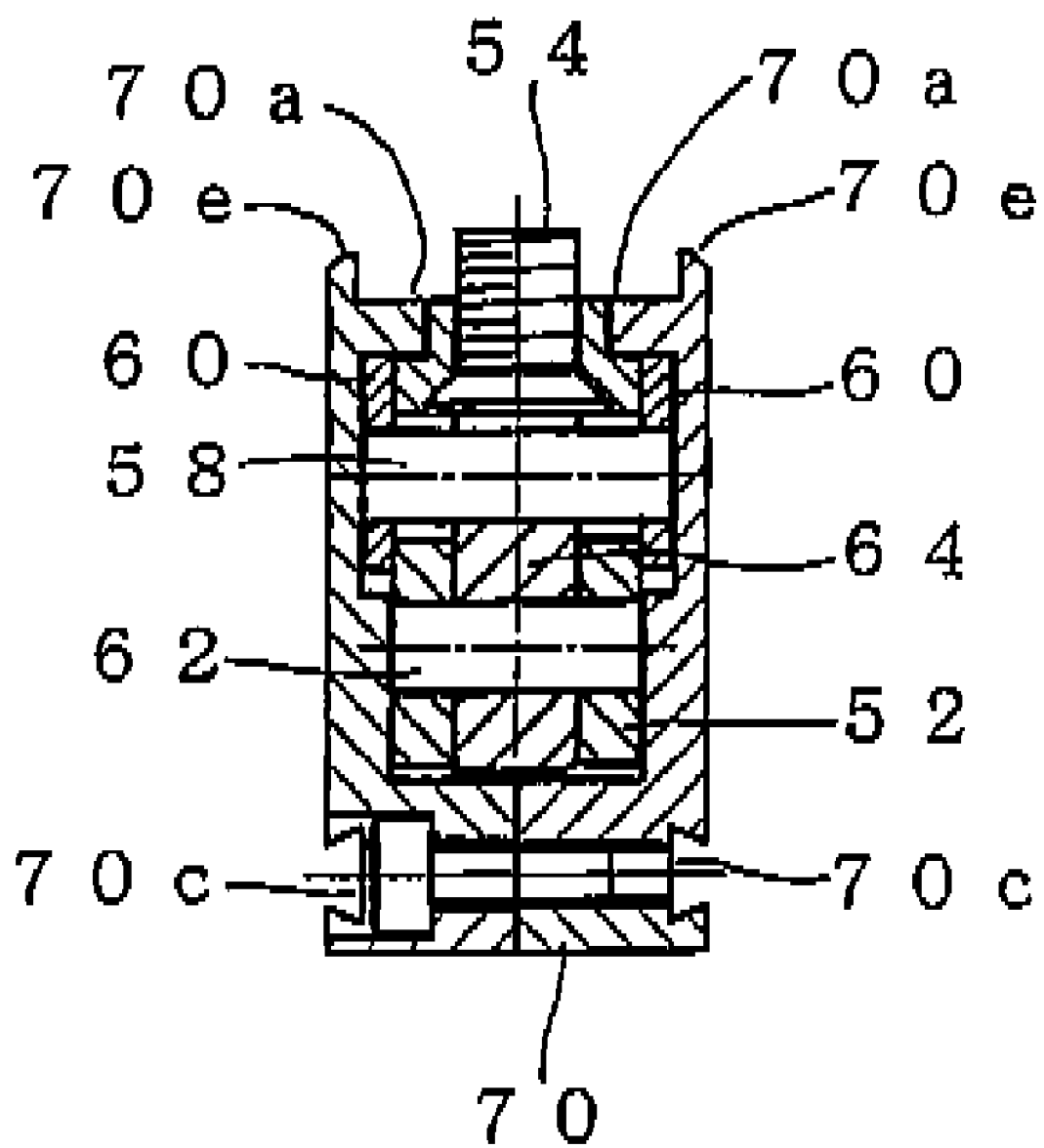
FIG. 3 is a vertical sectional view in a state where a guide block or so has been assembled to a rail member.

Now, a first embodiment of the invention will be described referring to FIGS. 1 to 11. In FIGS. 1 to 11, those members which are equal to or equivalent to the members in FIGS. 13A to 15 are denoted with the same reference numerals, and overlapped descriptions will be omitted.

Figure 4:
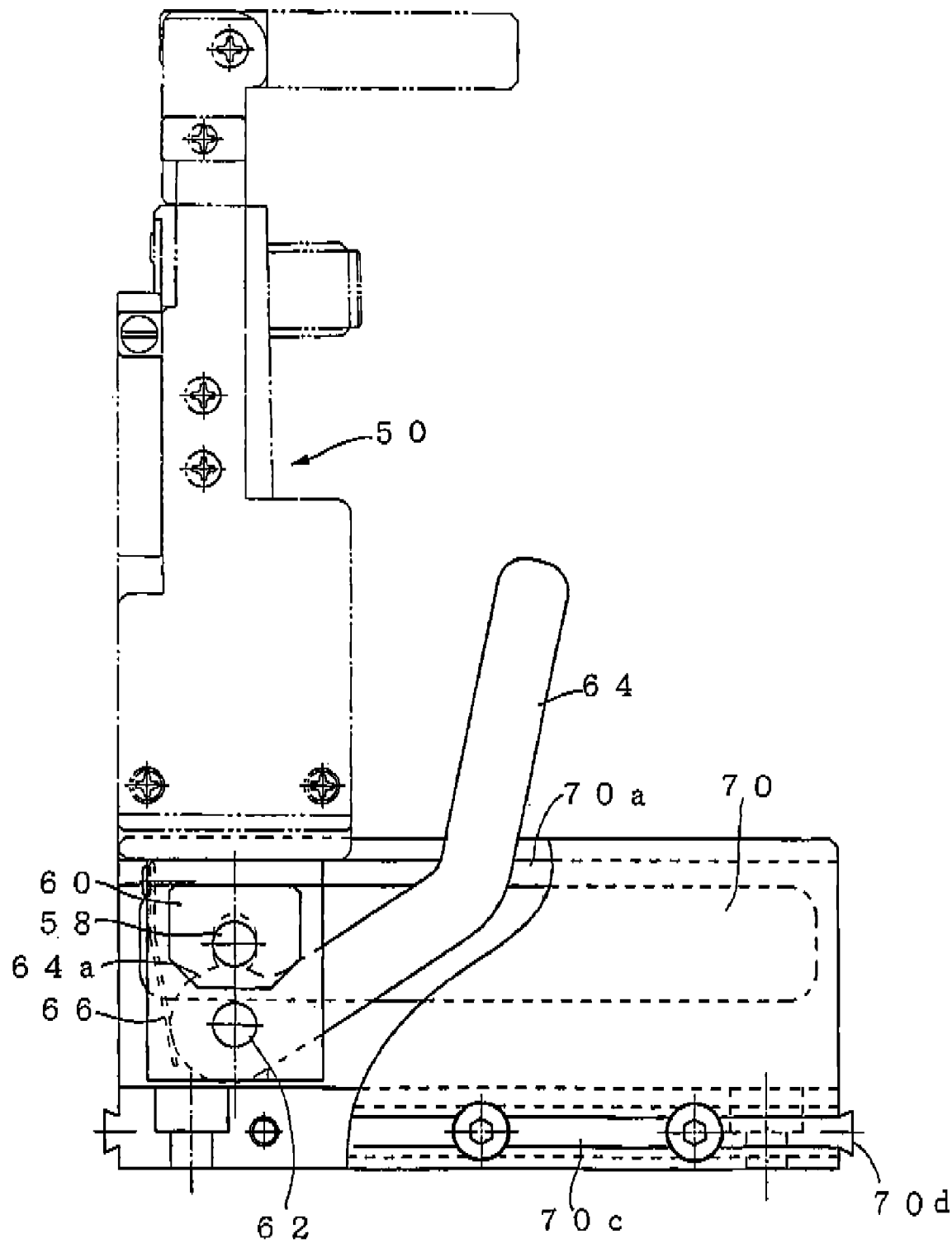
FIG. 4 is a side view partly cut away in which a fixing operating lever is swung to be tilted to one side for fixing the relay connector to the rail member.
Figure 5:
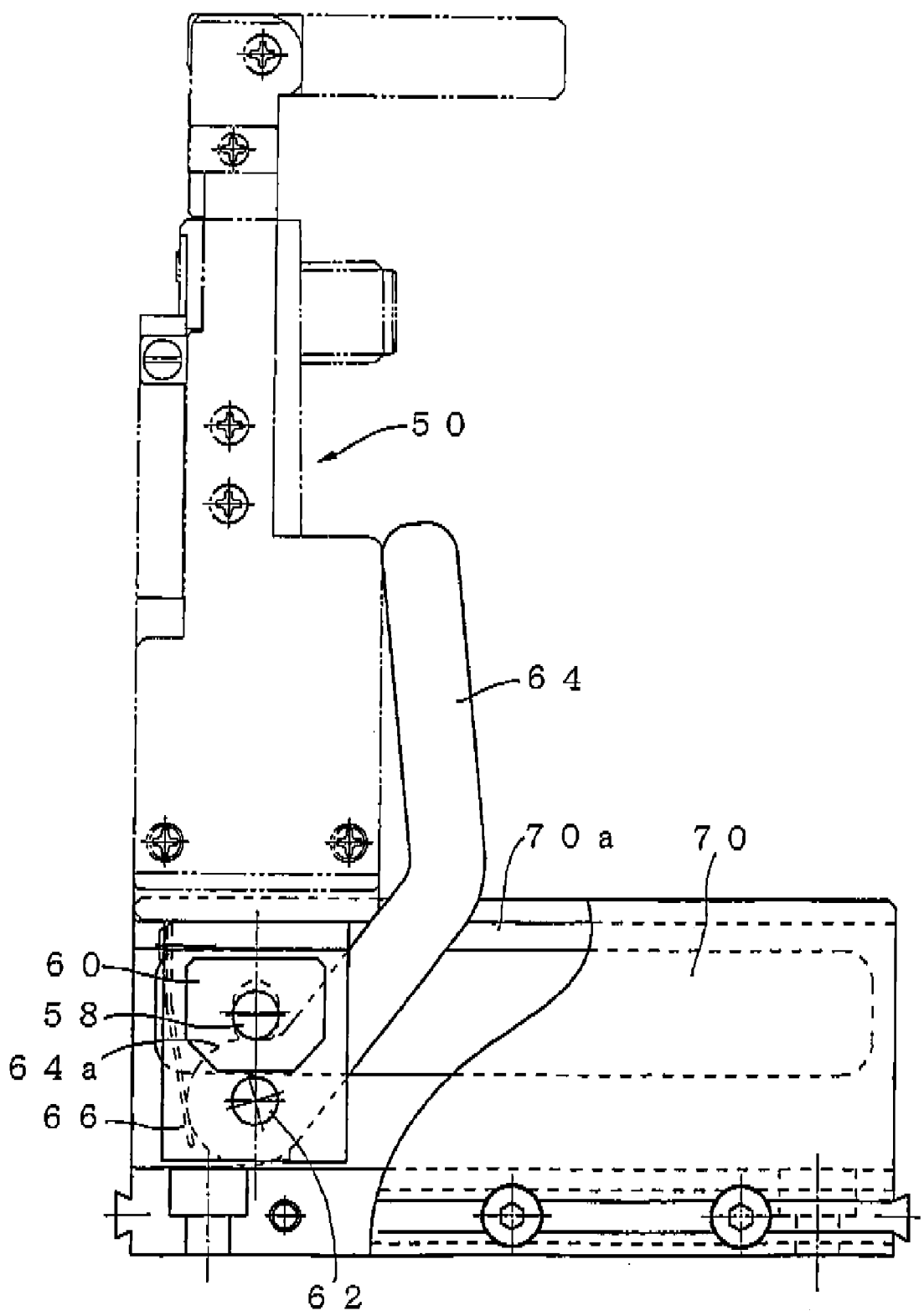
FIG. 5 is a side view partly cut away in which the fixing operating lever is swung to be tilted to the other side so as to bring the relay connector in a state not fixed to the rail member.

In FIGS. 1 to 11, in the fixing structure of the relay connector in the first embodiment of the invention, a guide block 52 in a U-shape which is open at a lower side, as seen in a projecting direction of a core conductor 22c, is fixed to a lower end surface of a relay connector 50 with a fixing screw 54. Moreover, a fixing pin 56 is inserted into both a lower end part of the relay connector 50 and the guide block 52 so that they may not be displaced in posture relative to each other. The guide block 52 is provided with elongated holes 52a, 52a which are longer in a vertical direction, so as to be opposed to each other at both sides of the U-shape. A movable support shaft 58 is passed through the elongated holes 52a, 52a so as to extend across the both sides of the U-shape of the guide block 52. This movable support shaft 58 extends in a direction perpendicular to the projecting direction of the core conductor 22c, and can move within a determined range in the vertical direction by means of the elongated holes 52a, 52a. Moreover, lock plates 60, 60 are respectively provided at both ends of the movable support shaft 58, outside the guide block 52 at both sides. Further, a lever support shaft 62 is provided across the both sides of the U-shape of the guide block 52 below the movable support shaft 58, in a direction perpendicular to the projecting direction of the core conductor 22c and in parallel with the movable support shaft 58. A fixing operating lever 64 is provided inside the U-shape of the guide block 52, so as to swing within a determined range around this lever support shaft 62. This fixing operating lever 64 is provided with a cam part 64a for the movable support shaft. A radial dimension of the cam part 64a for the movable support shaft is varied according to a position where it comes into contact with the movable support shaft 58, when the fixing operating lever 64 swings. When the fixing operating lever 64 is tilted to one side, as shown in FIG. 4, a radius of the cam part 64a for the movable support shaft at a position in contact with the movable support shaft 58 is large, and the movable support shaft 58 is moved upward. On the other hand, when the fixing operating lever 64 is tilted to the other side, as shown in FIG. 5, the radius of the cam part 64a for the movable support shaft at a position in contact with the movable support shaft 58 is small, and the movable support shaft 58 is allowed to move downward. Reference numeral 66 designates a pressure plate formed of sheet metal having elasticity. One end of the pressure plate 66 is fixed to the guide block 52, and the other end thereof is in elastic contact with the cam part 64a for the movable support shaft in the fixing operating lever 64, whereby swing of the fixing operating lever 64 with a small force is regulated by the elastic force of the pressure plate 66.

A rail member 70 includes two members in a substantially L-shape in cross section which are opposed to each other and fixed with screws 72, 72 to be integrally assembled. A pair of slide parts 70a, 70a formed of ribs which are longer in the projecting direction of the core conductor 22c, in parallel with each other, and longer in their longitudinal direction are provided so as to be opposed to each other. The guide block 52 is inserted between a pair of the slide parts 70a, 70a which are opposed to each other, and allowed to move in the longitudinal direction. Moreover, inner walls of the rail member 70 which are opposed to each other are respectively provided with recesses 70b, 70b for the lock plates, into which the lock plates 60, 60 can be inserted. It is so set that both side surfaces of an upper part of the guide block 52 are in sliding contact with edges of a pair of the slide parts 70a, 70a, the lock plates 60, 60 are in sliding contact with inner walls of the recesses 70b, 70b for the lock plates, and further, both side surfaces of a lower part of the guide block 52 are in sliding contact with the inner walls of the rail member 70 at a lower side thereof which are opposed to each other. Further, regulating projections 70e, 70e are provided at an upper end part of the rail member 70 so as to come into sliding contact with both sides of a lower part of the relay connector 50. Still further, the rail member 70 is provided with dovetail grooves 70c or dovetail projections 70d which can be engaged with the dovetail grooves 70c, at both ends thereof. In FIG. 1, the dovetail groove 70c is provided at a distal end of one of the two members to be assembled, and the dovetail projection 70d is provided at a distal end of the other member. Moreover, the dovetail projection 70d is provided at a backward end of one of the two members to be assembled, and the dovetail groove 70c is provided at a backward end of the other member. The rail member 70 is further provided, at both side surfaces thereof, with the dovetail grooves 70c which can be engaged with the dovetail projections 70d provided at the distal end.

Figure 6:
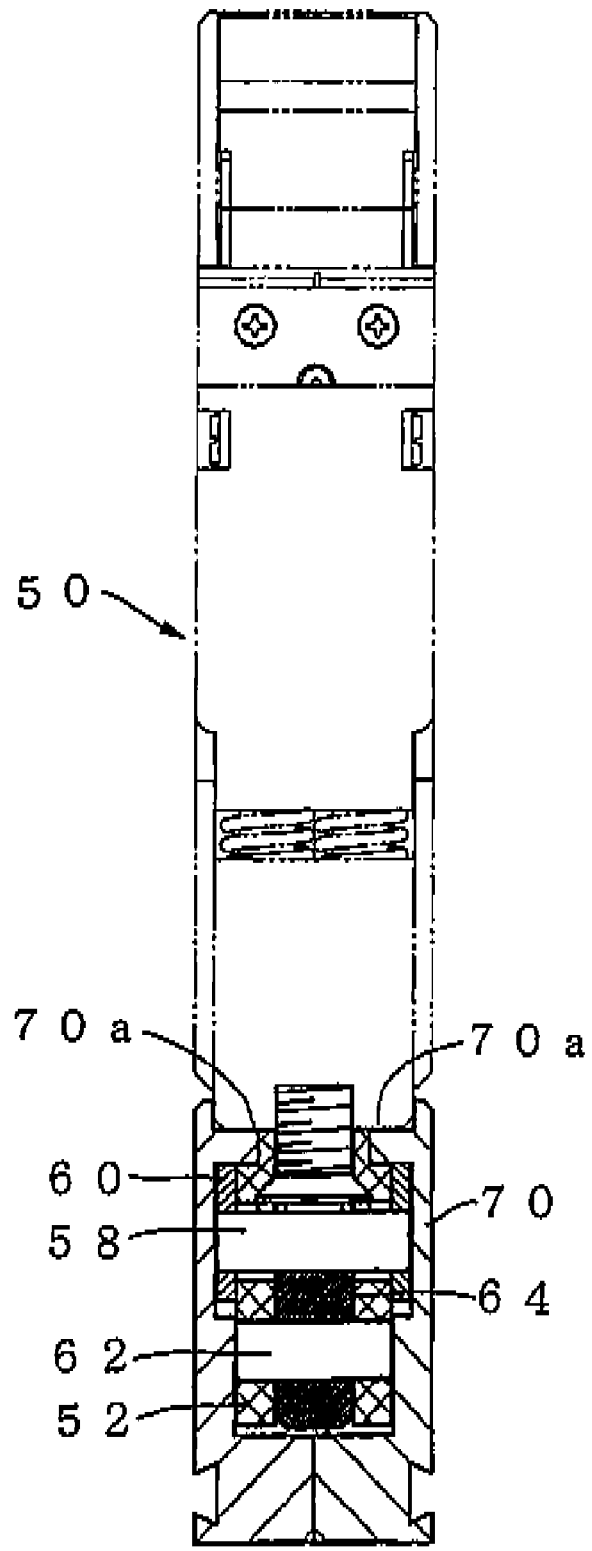
FIG. 6 is a vertical sectional view in a state where the guide block has been fixed to the rail member in FIG. 4.
Figure 7:
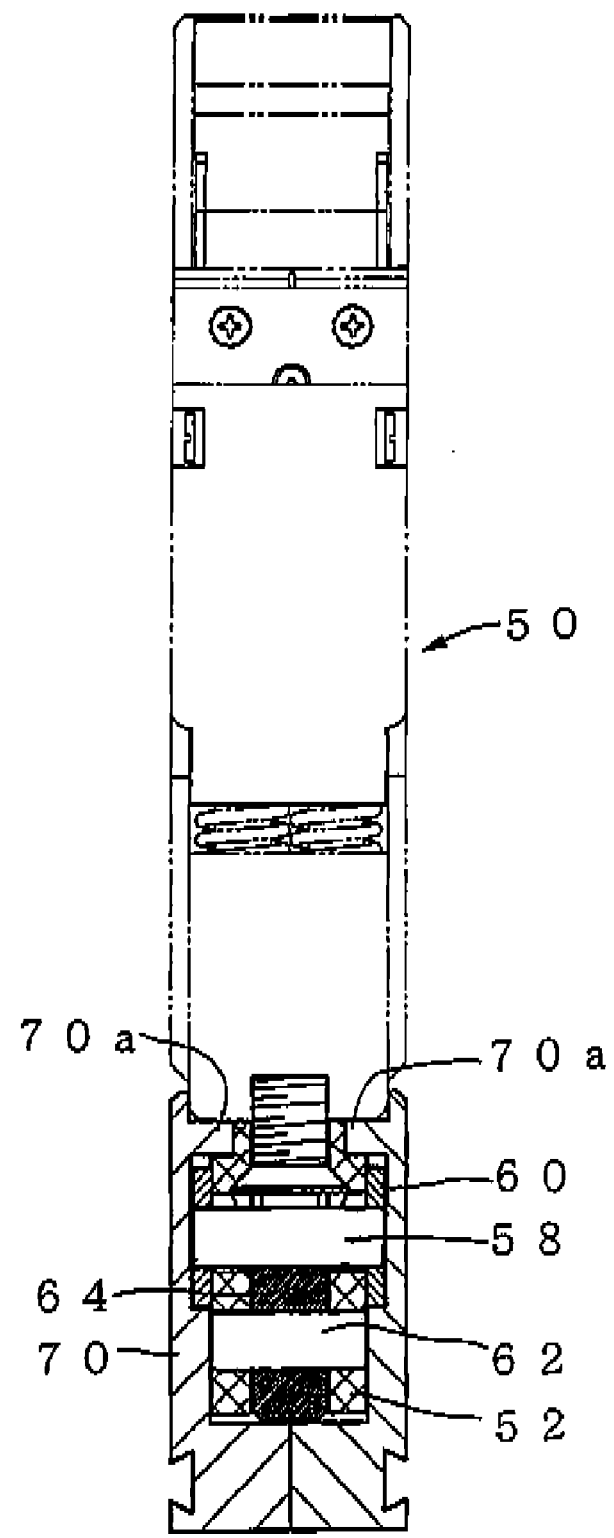
FIG. 7 is a vertical sectional view in a state where the guide block is not fixed to the rail member in FIG. 5.

In the above described structure, when the fixing operating lever 64 is tilted to the one side thereby to move the movable support shaft 58 upward by means of the cam part 64a for the movable support shaft, as shown in FIG. 4, the lock plates 60, 60 are moved upward and strongly press lower surfaces of the slide parts 70a, 70a upward, as shown in FIGS. 4 and 6. Then, the guide block 52 is pressed downward with a strong force, and the lower end surface of the relay connector 50 strongly presses upper surfaces of the slide parts 70a, 70a. Consequently, the upper and lower surfaces of the slide parts 70a, 70a are clamped between the lock plates 60, 60 and the lower end surface of the relay connector 50, whereby the relay connector 50 is fixed to the rail member 70. On the other hand, when the fixing operating lever 64 is tilted to the other side, as shown in FIG. 5, the cam part 64a for the movable support shaft allows the movable support shaft 58 to move downward, and the lock plates 60, 60 can move downward thereby to be detached from the lower surfaces of the slide parts 70a, 70a, as shown in FIGS. 5 and 7. In this state, a force for pressing the guide block 52 downward is reduced, and a force for clamping the slide parts 70a, 70a between the lock plates 60, 60 and the relay connector 50 is released, thereby enabling the relay connector 50 to move on the longitudinal direction of the rail member 70. In case where the recesses 70b, 70b for the lock plates which are provided in the inner walls of the rail member 70 opposed to each other are not provided up to both ends of the rail member 70, as shown in the first embodiment, the guide block 52 which has been assembled to the rail member 70 will not be disengaged and detached from the rail member 70 in the longitudinal direction. It is so set that both the side surfaces of the upper part of the guide block 52 are in sliding contact with the edges of a pair of the slide parts 70a, 70a, the lock plates 60, 60 are in sliding contact with the inner walls of the recesses 70b, 70b for the lock plates, and further, both the side surfaces of the lower part of the guide block 52 are in sliding contact with the inner walls of the rail member 70 at the lower side thereof which are opposed to each other. Further, the regulating projections 70e, 70e are provided at the upper end part of the rail member 70 so as to come into sliding contact with both sides of the lower part of the relay connector 50. As the results, a posture of the guide block 52 with respect to the rail member 70 is stabilized, and hence, a posture of the relay connector 50 with respect to the rail member 70 is also stabilized.

Figure 8:
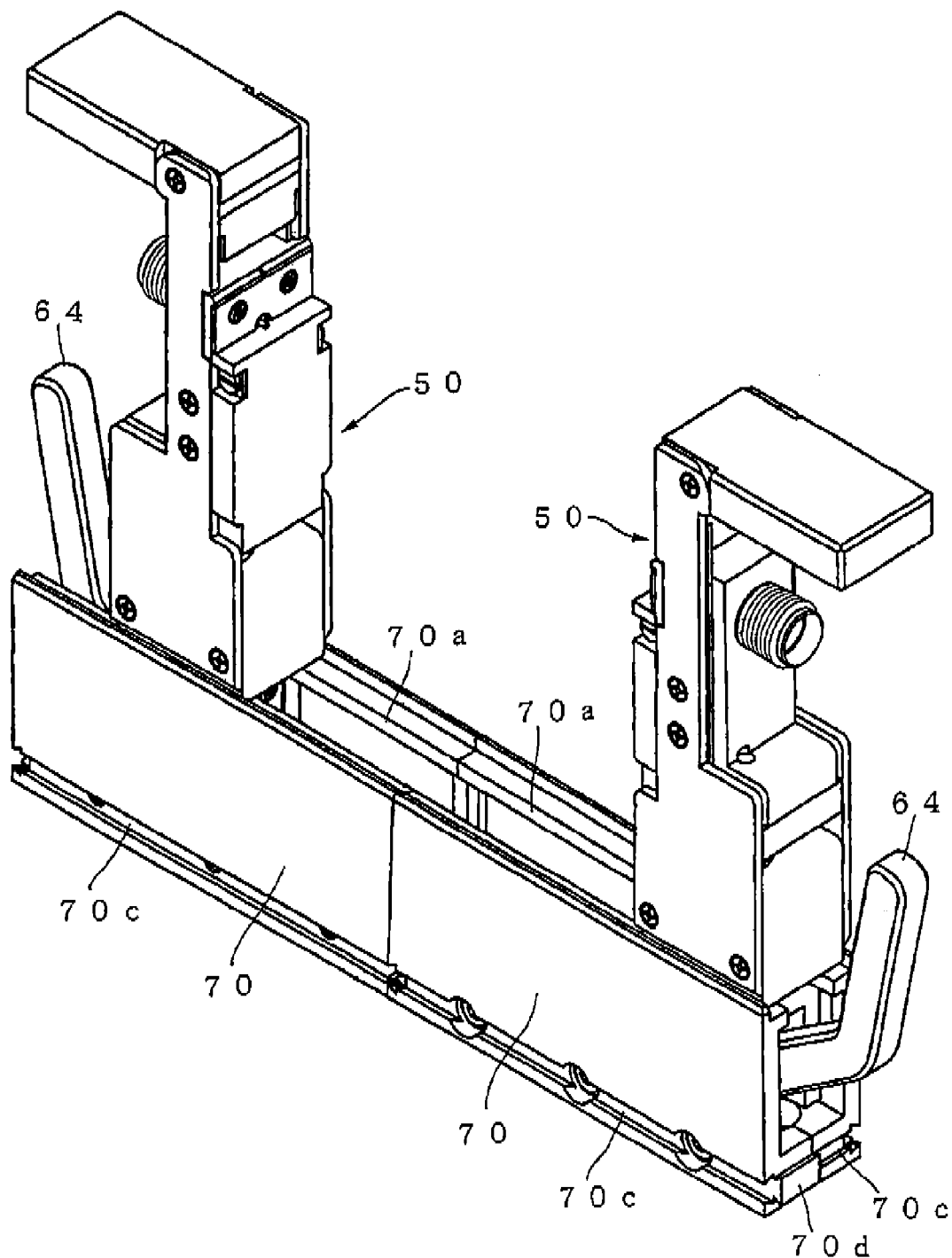
FIG. 8 is a perspective view showing an outer appearance in a state where the rail members are connected in series in a longitudinal direction and two relay connectors are arranged so as to be opposed to each other.
Figure 9:
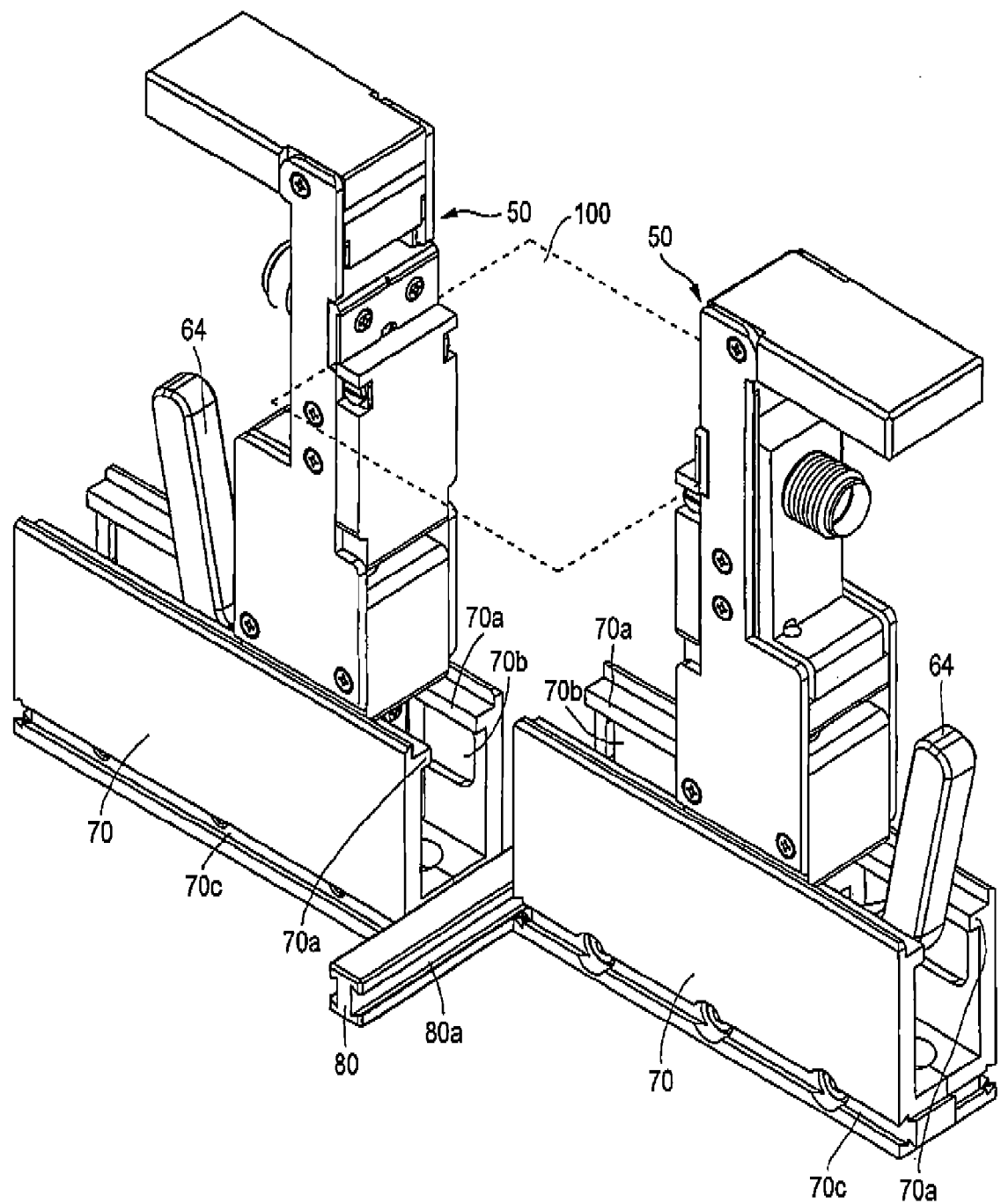
FIG. 9 is a perspective view showing an outer appearance in a state where distal ends of two rail members are respectively connected to both sides of a connecting rail member, and two relay connectors which are opposed in the longitudinal direction are arranged so as to be displaced in a lateral direction.
Figure 10:
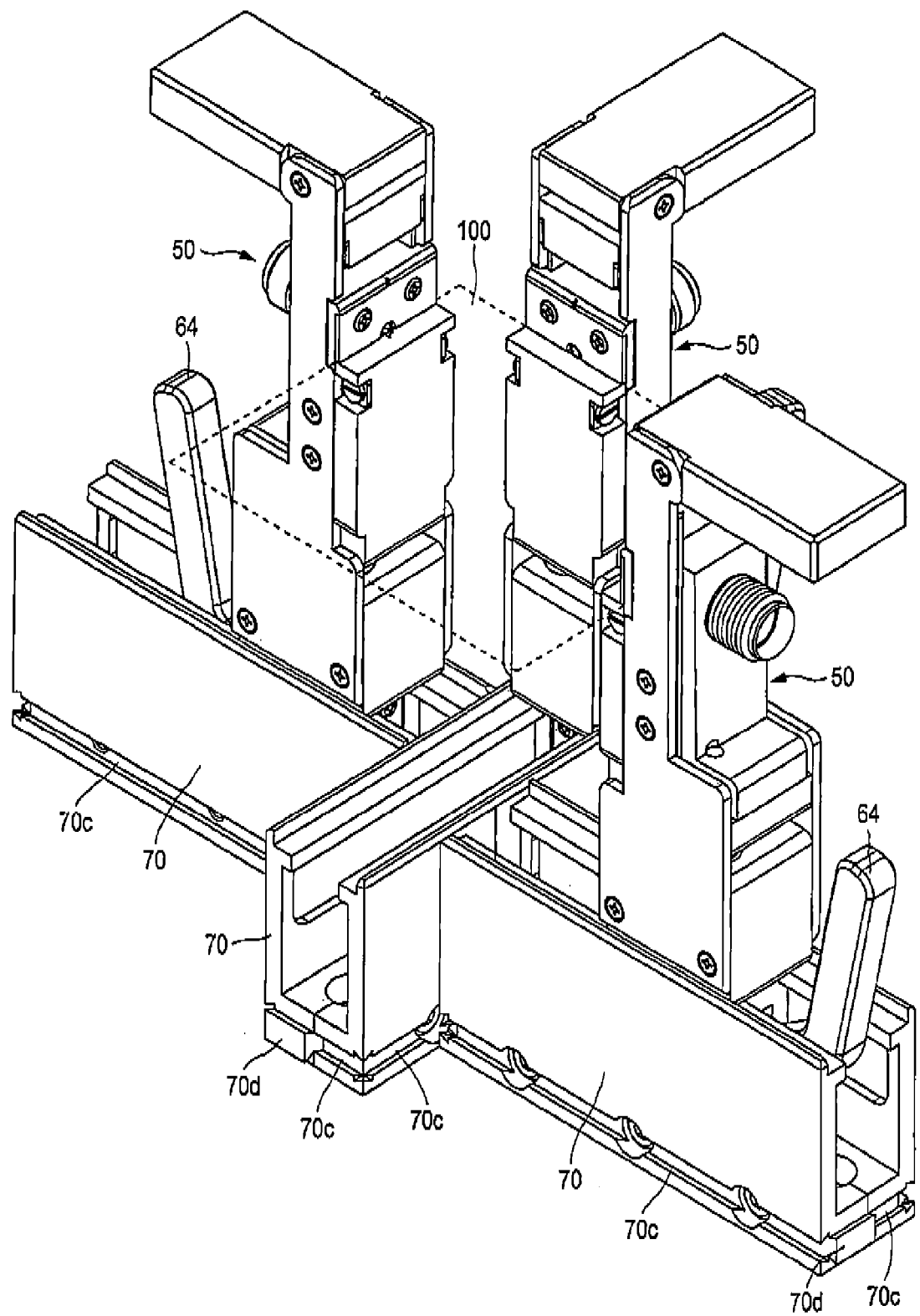
FIG. 10 is a perspective view showing an outer appearance in a state where distal ends of two rail members are respectively connected to both sides of one rail member, and three relay connectors are arranged with respect to three sides of a board.
Figure 11:
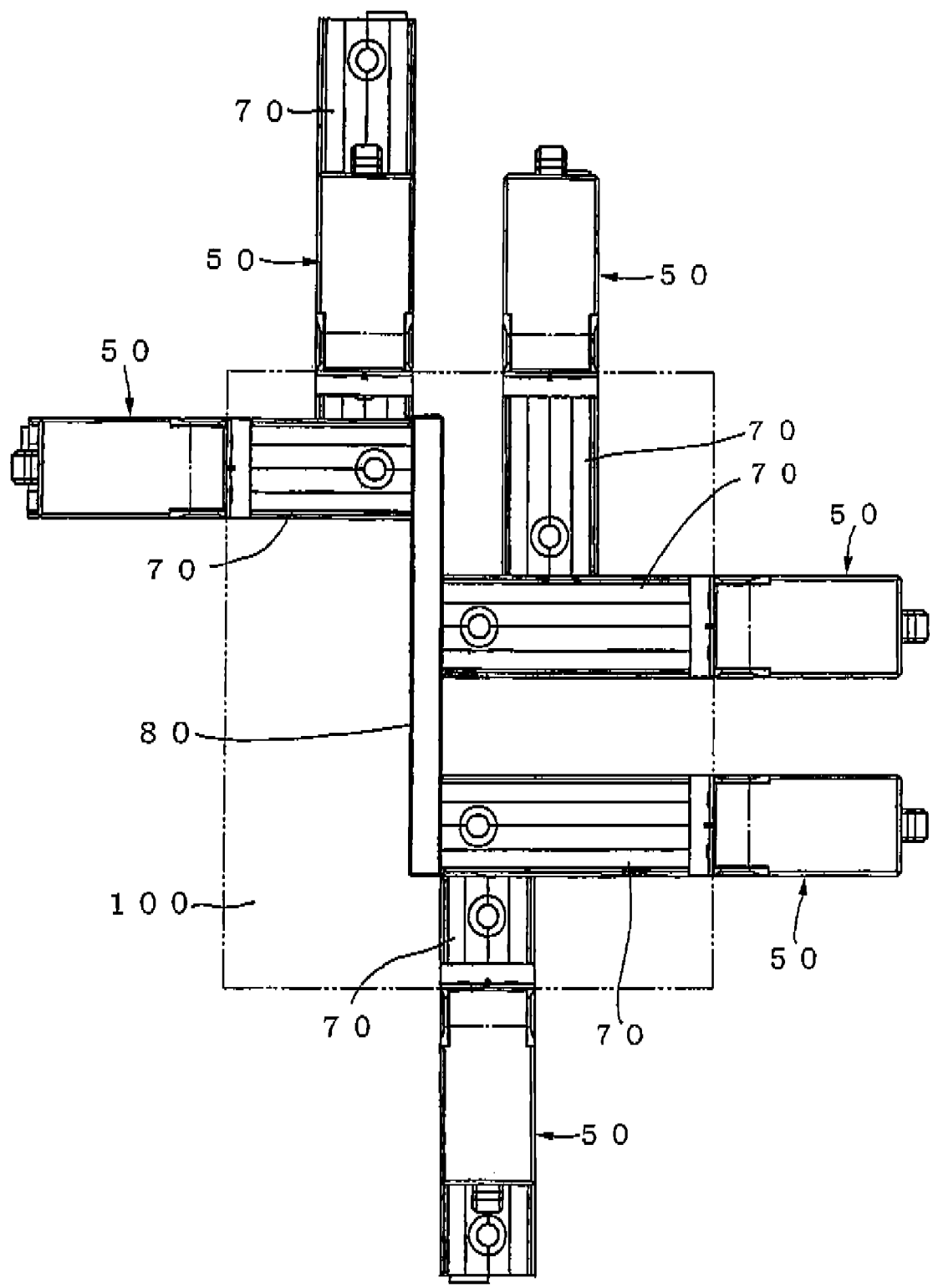
FIG. 11 is a plan view in a state where distal ends of other rail members are appropriately connected to the connecting rail member and the rail member, and a plurality of relay connectors are arranged with respect to four sides of the board.

In the first embodiment, by respectively engaging the dovetail grooves 70c with the dovetail projections 70d at the ends of the two rail members 70, 70, as shown in FIG. 8, it is possible to arrange the two relay connectors 50, 50 so as to be opposed to each other in the longitudinal direction of the rail members 70, 70 in such a manner that the relay connectors 50, 50 can be moved and fixed in the longitudinal direction. Moreover, in FIG. 9, the dovetail grooves 70c and the dovetail projections 70d at the ends of the two rail members 70, 70 are engaged with dovetail grooves 80a, 80a which are provided on both side surfaces of a single connecting rail member 80. The connecting rail member 80 is provided with the dovetail grooves 80a, 80a which can be engaged with the dovetail projections 70d provided at the ends of the rail members 70, 70, on both the side surfaces thereof. In this assembly as shown in FIG. 9, the two relay connectors 50, 50 are arranged so as to be opposed to each other in the longitudinal direction of the respective rail members 70, 70, in such a manner that the relay connectors 50, 50 can be moved and fixed in the longitudinal direction, and at the same time, the two relay connectors 50, 50 can be displaced sideward from each other in a longitudinal direction of the connecting rail member 80, with respect to positions of terminal electrodes which are provided on a board 100. Further, in FIG. 10, the dovetail grooves 70c, 70c on both side surfaces of a single rail member 70 are engaged with the dovetail projections 70d, 70d at the distal ends of other two rail members 70, 70. In this manner, it is possible to arrange the three relay connectors 50, 50, 50 with respect to the terminal electrodes which are provided at three sides of the board 100. Further, in FIG. 11, the six rail members 70, 70 . . . are assembled to a single connecting rail member 80, and a plurality of the relay connectors 50, 50 . . . can be arranged with respect to the board 100 so as to be moved and fixed in X-Y directions. It is apparent that the rail members 70, 70 . . . and the connecting rail member 80 in FIGS. 8 to 11 may be appropriately fixed to a base seat which is not shown.

Figure 12:
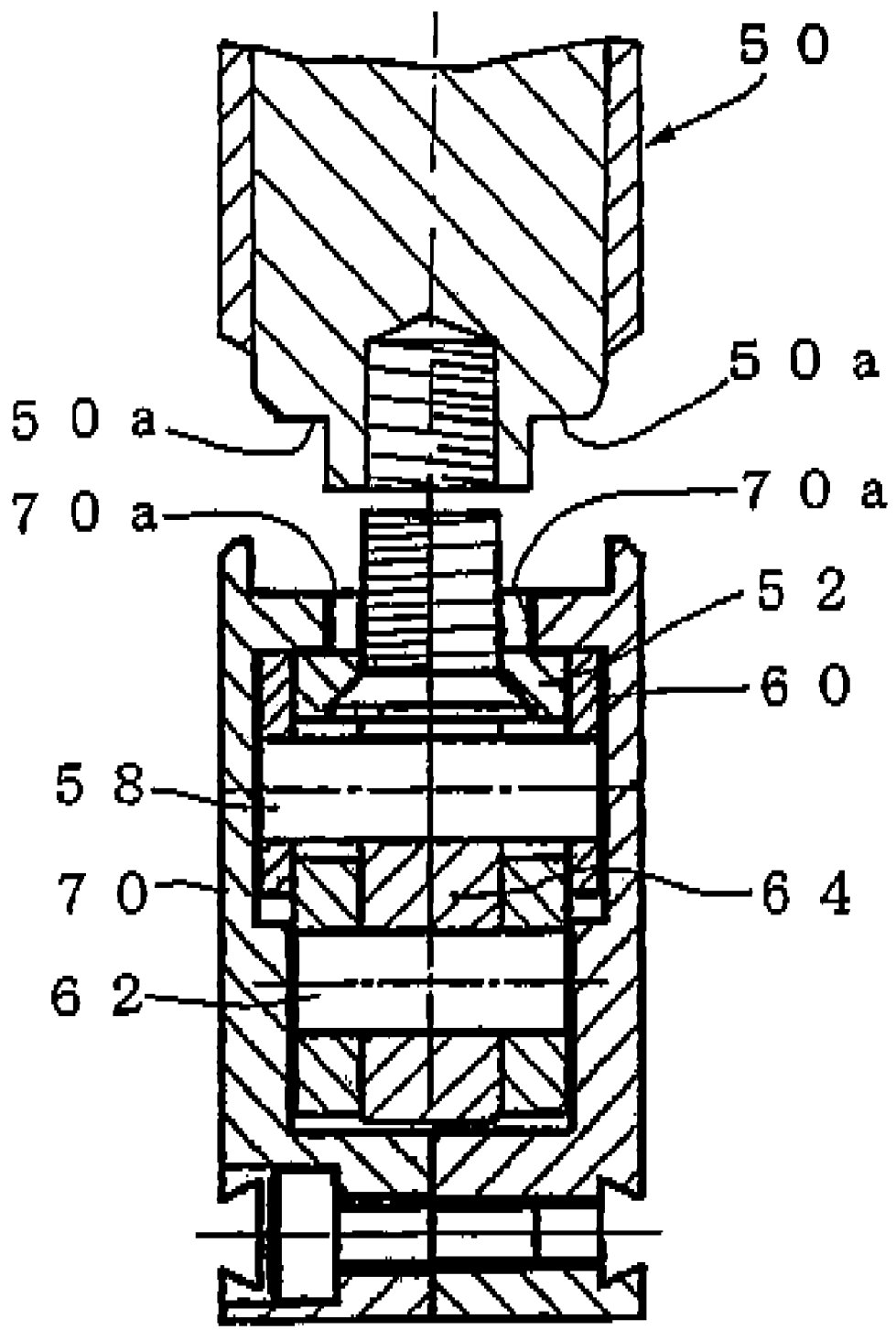
FIG. 12 is a vertical sectional view of a fixing structure of a relay connector in a second embodiment of the invention, showing a manner of fixing a lower end part of the relay connector to a guide block.
Figure 13B:
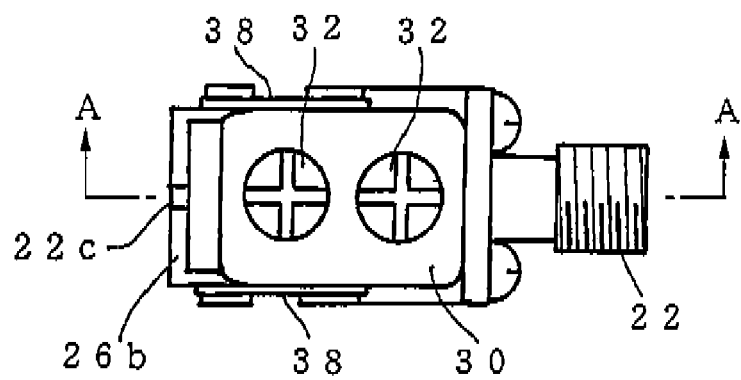
FIGS. 13A, 13B and 13C are views showing an outer appearance of a related-art relay connector.
Figure 13C:
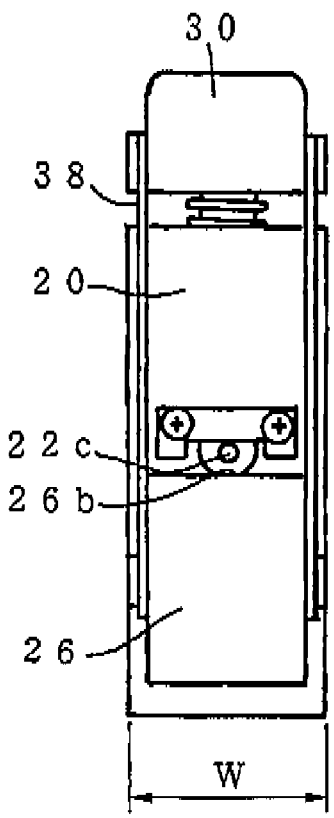
Figure 13A:
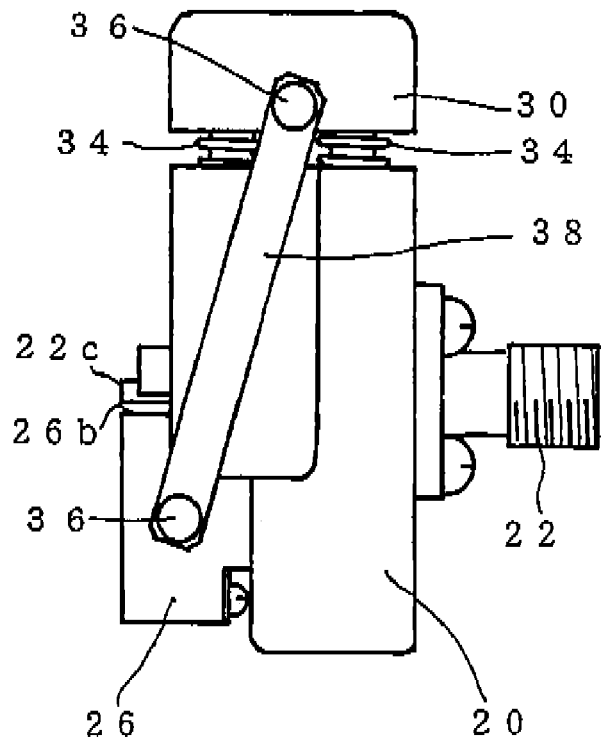
Figure 14:
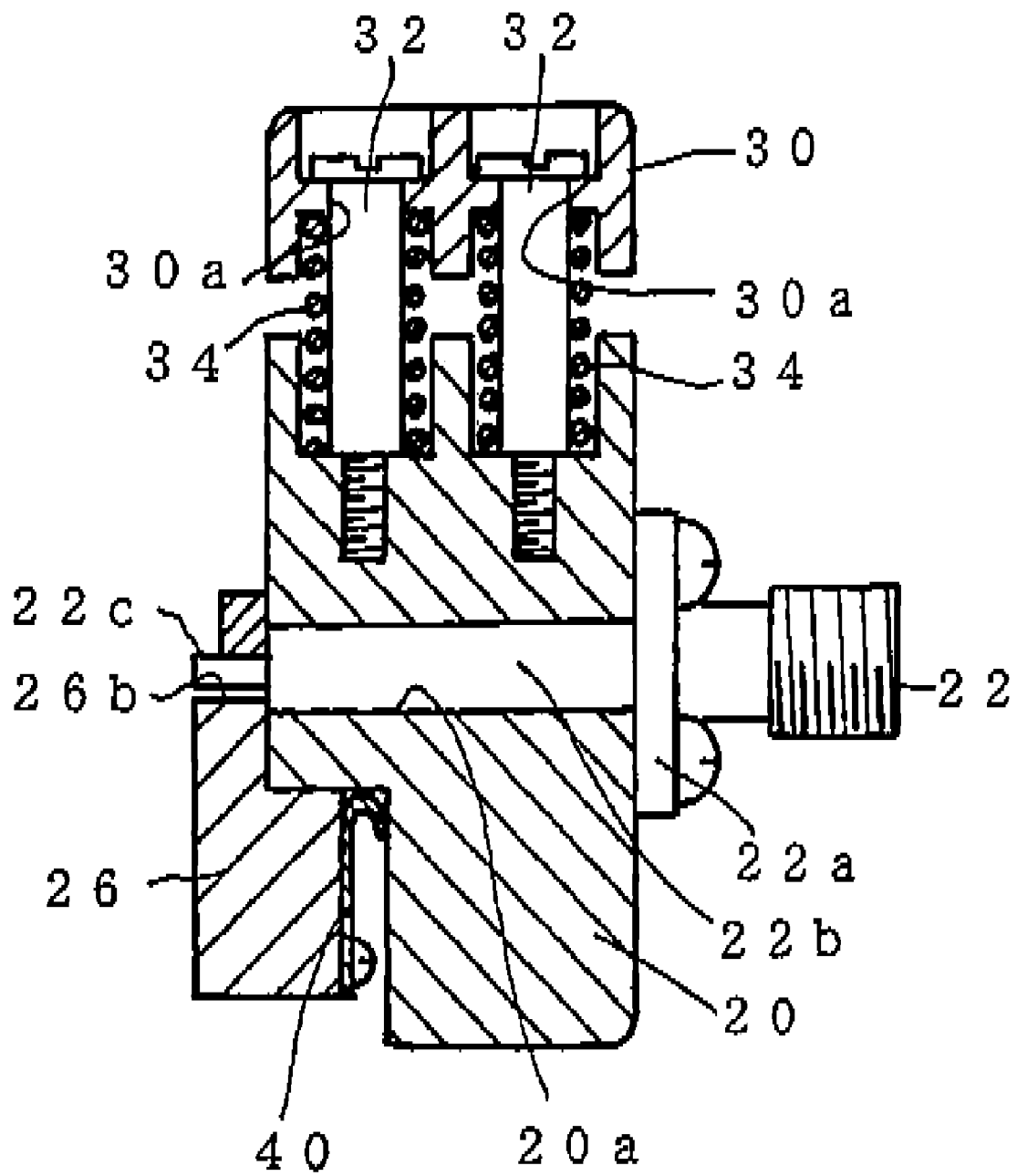
FIG. 14 is a sectional view as seen from arrow marks A-A in FIG. 13B.
Figure 15:
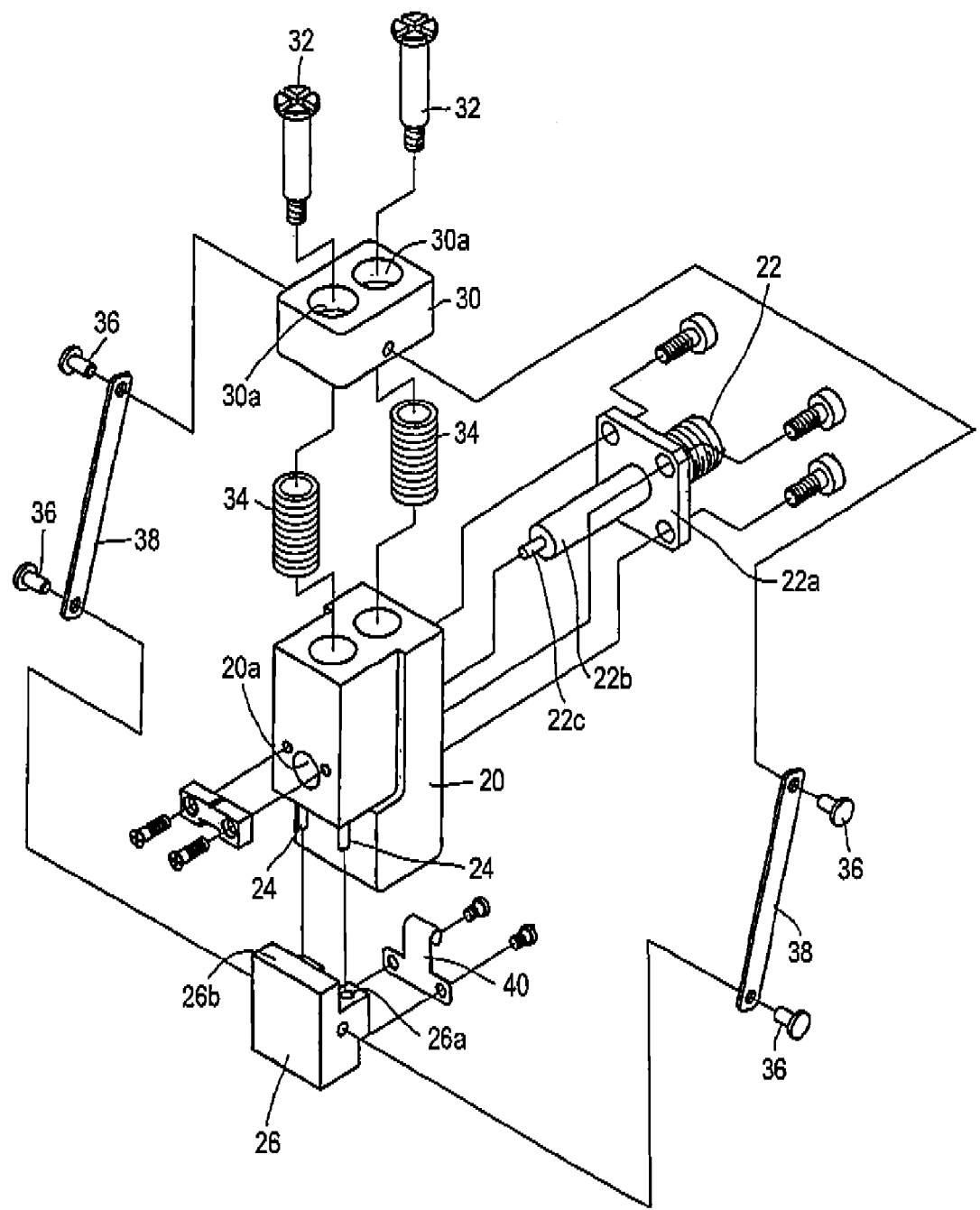
FIG. 15 is an exploded perspective view of the relay connector as shown in FIGS. 13A to 13C.

Then, a second embodiment of the invention will be described referring to FIG. 12. FIG. 12 is a vertical sectional view of a fixing structure of a relay connector in the second embodiment of the invention, showing a manner of fixing the lower end part of the relay connector to the guide block. In FIG. 12, those members which are equal or equivalent to those in FIGS. 1 to 11 will be denoted with the same reference numerals, and overlapped descriptions will be omitted.

In the second embodiment as shown in FIG. 12, the lower end part of the relay connector 50 is provided with stepped portions 50a, 50a at both sides thereof, and a downwardly projected portion in a center part. The downwardly projected portion in the center part is inserted between the slide parts 70a, 70a of the rail member 70 which are opposed to each other, and the guide block 52 is fixed to a lower end surface of the center part. In the second embodiment having such structure, a posture of the relay connector 50 can be regulated by the center part having the downwardly projected portion at the lower end of the relay connector 50 which has been inserted between the slide parts 70*a*, 70*a*. Therefore, a structure for preventing relative displacement in posture between the relay connector 50 and the guide block 52, as in the first embodiment, is not required.

The relay connector 50 to be used in the above described embodiments may have any structure, provided that the distance between the core conductor of the coaxial connector and the board rest part is enlarged so that the board can be inserted between them, and the board can be clamped between them, for the purpose of electrically connecting the core conductor of the coaxial connector to the terminal electrode which is provided at the end of the surface of the board, and electrically connecting the shell GND of the coaxial connector to the GND electrode which is provided at the end of the back surface of the board. Moreover, the rail member 70 is not limited to such structure that the two members of the rail member 70 are respectively provided with the dovetail grooves and the dovetail projections at the ends, but may be such structure that the dovetail groove is provided at one end of the rail member 70 and the dovetail projection is provided at the other end. Further, it is possible to provide the dovetail groove 70*c* at the end of the rail member 70, and the dovetail projections 70*d* in side parts of the rail member 70. Still further, the rail member 70 and the connecting rail member 80 are not limited to such structure that the dovetail grooves 70*c*, 80*a* or the dovetail projections 70*d* are provided on both the side surfaces, but may be such structure that the dovetail grooves 70*c*, 80*a* or the dovetail projections 70*d* are provided on the side surface at only one side thereof. Still further, in the above described embodiments, an escape of the guide block 52 from the rail member 70 is regulated, by assembling the rail member 70 from both sides of the guide block 52, because the recesses 70*b*, 70*b* for the lock plates which are provided on the inner walls of the rail member 70 are not provided up to the both ends of the rail member 70. However, in case where the recesses 70*b*, 70*b* for the lock plates which are provided on the inner walls of the rail member 70 are extended up to the ends of the rail member 70, it is possible to insert the guide block 52 from the end of the rail member 70, after the rail member 70 has been assembled. Further, provided that the relay connector 50 can be fixed to the rail member 70 in a stabilized posture, both the side surfaces of the upper part of the guide block 52 need not be in sliding contact with the opposed edges of a pair of the slide parts 70*a*, 70*a*, or the lock plates 60, 60 need not be in sliding contact with the inner walls of the recesses 70*b*, 70*b* for the lock plates, and further, both the side surfaces of the lower part of the guide block 52 need not be in sliding contact with the opposed inner walls of the rail member 70 at the lower side. Still further, the regulating projections 70*e*, 70*e* need not be provided on the upper end part of the rail member 70 so as to come into sliding contact with both sides of the lower part of the relay connector 50. Still further, the recesses 70*b*, 70*b* for the lock plates need not be provided. Still further, the rail member 70 is not limited to such structure that the two members are assembled to form the rail member 70 as in the above described embodiments, but may be formed of a single member, provided that the guide block 52 can be inserted into the rail member 70 from the end.

According to an aspect of the invention, when the fixing operating lever is swung to be tilted to one side, the lock plates strongly press the lower surfaces of the slide parts thereby to push the guide block downward, and the upper and lower surfaces of the slide parts are rigidly clamped between the lock plates and the both sides of the lower end part of the relay connector, whereby the relay connector can be reliably fixed.

Moreover, when the fixing operating lever is tilted to the other side, the lock plates are allowed to move downward, and the slide parts are released from the clamped and fixed state, whereby the relay connector can be easily moved in the longitudinal direction.

Moreover, according to an aspect of the invention, the lower end part of the relay connector is provided with the stepped portions at the both sides thereof, and the downwardly projected portion in the center part. The center part of the relay connector which is provided with the stepped portions and the downwardly projected portion is inserted between a pair of the slide parts which are opposed to each other so as to move in the longitudinal direction, in such a manner that both sides of the lower end part of the relay connector are respectively mounted on the upper surfaces of a pair of the slide parts. Therefore, a posture of the relay connector (direction of the relay connector) is regulated by the center part of the lower end part having the downwardly projected portion in cooperation with a pair of the slide parts. As the results, the moving direction of the relay connector along the slide parts can be easily maintained to be equal to the projecting direction of the core conductor.

Further, according to an aspect of the invention, the pressure plate formed of leaf spring is elastically contacted with the fixing operating lever so that the swing of the fixing operating lever can be regulated by the elastic force of the pressure plate. Therefore, in a state where the relay connector is not fixed, the posture of the relay connector will not be changed accidentally with the swing of the fixing operating lever.

Still further, according to an aspect of the invention, the two members respectively having one of the slide parts are opposed to each other and integrally fixed together at a determined distance thereby to form the rail member. Therefore, it is possible to integrally form the rail member so as to clamp the guide block or so, after the guide block or so has been fixed to the lower end part of the relay connector, and hence, the assembling work can be easily performed.

Still further, according to an aspect of the invention, the rail member is provided with the dovetail grooves or the dovetail projections which can be engaged with the dovetail grooves at the both ends thereof, so that the two rail members can be connected in series in the longitudinal direction. Therefore, by connecting the rail members, it is possible to set a distance between the two relay connectors which are opposed to each other, as desired.

Still further, according to an aspect of the invention, the rail member is provided, on the side surface thereof, with the dovetail groove or the dovetail projection which can be engaged with the dovetail groove, or the dovetail projection provided at the end of the rail member, so that the distal end of another rail member can be connected to the side surface of the rail member in a direction perpendicular to the side surface. Therefore, it is possible to assemble a plurality of the relay connectors so as to move in the X-Y directions.

Still further, according to an aspect of the invention, the connecting rail member is provided with the dovetail grooves or the dovetail projections which can be engaged with the dovetail grooves or the dovetail projections provided at the end of the rail member, on the side surfaces at both sides or on the side surface at one side thereof, so that the distal end of the rail, member can be connected to the side surface of the connecting rail member in a direction perpendicular to the side surface. Therefore, it is possible to assemble a plurality of the relay connectors so as to be displaced in the lateral direction by means of the connecting rail member.

What is claimed is:

1. A fixing structure of a relay connector in which a core conductor of a coaxial connector is connected to a terminal electrode which is provided at an end of a surface of a board, and a shell GND of the coaxial connector is connected to a GND electrode which is provided at an end of a back surface of the board, the core conductor being projected from a surface of a conductive first block, a conductive second block having a board rest part on which the board is to be placed, the second block being electrically connected to the first block and operable to move with respect to the first block so that the board rest part relatively moves in a direction of approaching or separating from the core conductor in a direction parallel to the surface of the first block, whereby a distance between the core conductor and the board rest part is enlarged for enabling the board to be inserted between the core conductor and the board rest part, and the board is clamped between the core conductor and the board rest part, the fixing structure of the relay connector comprising:

a guide block including a first member, a second member opposed to the first member and a third member connected to the first and second members, the first, second and third members defining a U shape opened to a lower side, the third member is fixed to a lower portion of the relay connector;

a movable support shaft passing through the first and second members of the guide block so as to be movable in a first direction perpendicular to a second direction which is parallel to an axial direction of the coaxial connector;

lock plates respectively provided at both ends of the movable support shaft outside of the guide block;

a lever support shaft provided below the movable support shaft across the first and second members of the guide block in the first direction;

a fixing operating lever provided inside the guide block so as to swing around the lever support shaft and provided with a cam part adapted to come into contact with the movable support shaft so as to move the movable support shaft in the first direction; and a rail member extending in the second direction and provided with a pair of slide parts which are parallel and opposed to each other, the guide block being inserted between the slide parts so as to be movable in the second direction, both side parts of the lower portion of the relay connector being mounted on upper surfaces of the slide parts, the lock plates being opposed to lower surfaces of the slide parts, wherein when the fixing operating lever is swung to be tilted to one side, the movable support shaft is pushed upward by the cam part, and the lock plates press the lower surfaces of the slide parts thereby to push the guide block downward, whereby the upper and lower surfaces of the slide parts are clamped and fixed between the side parts of the lower portion of the relay connector and the lock plates, and when the fixing operating lever is swung to be tilted to the other side, the cam part allows the movable support shaft to move downward thereby to move the lock plates downward, whereby the relay connector which is mounted on the upper surfaces of the slide parts can move in the second direction.

2. The fixing structure of the relay connector according to claim 1, wherein the lower portion of the relay connector is formed with a projected portion, both side parts of the projected portion which are formed with stepped portions, a center part of the projected portion which is downwardly projected and to which the third member of the guide block is fixed, the center part of the projected portion is inserted between the slide parts, the stepped portions of the projected portion are mounted on the upper surfaces of the slide parts, when the fixing operating lever is swung to be tilted to one side, the movable support shaft is pushed upward by the cam part, and the lock plates press the lower surfaces of the slide parts thereby to push the guide block downward, whereby the upper and lower surfaces of the slide parts are clamped and fixed between the stepped portions of the projected portion and the lock plates.

3. The fixing structure of the relay connector according to claim 1, wherein one end of a pressure plate formed of leaf spring is fixed to the guide block, the other end of the pressure plate is in elastically contact with the fixing operating lever, whereby swing of the fixing operating lever is regulated by an elastic force of the pressure plate.

4. The fixing structure of the relay connector according to claim 1, wherein the rail member includes two members respectively having one of the slide parts, being opposed to each other having the slide parts placed inside, and integrally fixed together.

5. The fixing structure of the relay connector according to claim 1, wherein the rail member is formed with at least an engaging portion at one end portion thereof, so that another rail member can be connected in series in the second direction.

6. The fixing structure of the relay connector according to claim 1, wherein the rail member is formed with at least an engaging portion at a side portion thereof and another rail member is formed with an engaging portion at one end portion thereof, so that the side portion of the rail member can be connected to the end portion of the another rail member.

7. The fixing structure of the relay connector according to claim 1, wherein a connecting tail member is provided with an engaging portion, which can be engaged with an engaging portion formed at an end portion of the rail member, on at least one of side surfaces thereof, so that the end portion of the rail member can be connected to the at least one of the side surfaces of the connecting rail member.

* * * * *